(12) United States Patent
Liu et al.

(10) Patent No.: US 10,084,130 B2
(45) Date of Patent: Sep. 25, 2018

(54) RESISTANCE VARIABLE MEMORY DEVICE WITH NANOPARTICLE ELECTRODE AND METHOD OF FABRICATION

(71) Applicant: OVONYX MEMORY TECHNOLOGY, LLC, Alexandria, VA (US)

(72) Inventors: Jun Liu, Boise, ID (US); Kristy A. Campbell, Boise, ID (US)

(73) Assignee: OVONYX MEMORY TECHNOLOGY, LLC, Alexandria, VA (US)

( * ) Notice: Subject to any disclaimer, the term of this patent is extended or adjusted under 35 U.S.C. 154(b) by 0 days.

(21) Appl. No.: 14/948,893

(22) Filed: Nov. 23, 2015

(65) Prior Publication Data

US 2016/0079531 A1    Mar. 17, 2016

Related U.S. Application Data

(60) Division of application No. 14/524,435, filed on Oct. 27, 2014, now Pat. No. 9,224,948, which is a continuation of application No. 13/315,557, filed on Dec. 9, 2011, now Pat. No. 8,878,155, which is a continuation of application No. 12/355,541, filed on Jan. 16, 2009, now Pat. No. 8,088,643, which is a division of application No. 11/213,830, filed on Aug. 30, 2005, now Pat. No. 7,491,962.

(51) Int. Cl.
*H01L 45/00*    (2006.01)

(52) U.S. Cl.
CPC .......... *H01L 45/1675* (2013.01); *H01L 45/04* (2013.01); *H01L 45/085* (2013.01); *H01L 45/1233* (2013.01); *H01L 45/1253* (2013.01); *H01L 45/1266* (2013.01); *H01L 45/1273* (2013.01); *H01L 45/143* (2013.01); *H01L 45/16* (2013.01); *H01L 45/1616* (2013.01); *H01L 45/1625* (2013.01); *Y10S 977/773* (2013.01)

(58) Field of Classification Search
CPC ....... H01L 45/04; H01L 45/16; H01L 45/122; H01L 45/06; H01L 45/12; H01L 45/1233
See application file for complete search history.

(56) References Cited

U.S. PATENT DOCUMENTS

| | | |
|---|---|---|
| 3,530,441 A | 9/1970 | Ovshinsky |
| 5,536,947 A | 7/1996 | Klersy et al. |
| 5,825,046 A | 10/1998 | Czubatyj et al. |

(Continued)

FOREIGN PATENT DOCUMENTS

JP    2005-022886    *    1/2005    ............. C01B 31/02

OTHER PUBLICATIONS

Xu, J.M., Highly Ordered Carbon Nanotube Arrays and IR Detection, Infrared Physics & Technology 42 pp. 485-491, 2001.

(Continued)

*Primary Examiner* — Michael Lebentritt
*Assistant Examiner* — Suberr Chi
(74) *Attorney, Agent, or Firm* — Holland & Hart LLP

(57) ABSTRACT

A chalcogenide-based programmable conductor memory device and method of forming the device, wherein a nanoparticle is provided between an electrode and a chalcogenide glass region. The method of forming the nanoparticle utilizes a template over the electrode or random deposition of the nanoparticle.

18 Claims, 9 Drawing Sheets

(56) References Cited

U.S. PATENT DOCUMENTS

| | | | |
|---|---|---|---|
| 6,133,147 A * | 10/2000 | Rhee | H01L 21/76879 257/E21.586 |
| RE37,259 E | 7/2001 | Ovshinsky | |
| 6,325,909 B1 | 12/2001 | Li et al. | |
| 6,515,325 B1 | 2/2003 | Farnworth et al. | |
| 6,538,367 B1 | 3/2003 | Choi et al. | |
| 6,548,313 B1 | 4/2003 | Ravi | |
| 6,566,665 B2 | 5/2003 | Baglin et al. | |
| 6,566,704 B2 | 5/2003 | Choi et al. | |
| 6,849,868 B2 | 2/2005 | Campbell | |
| 7,374,174 B2 | 5/2008 | Liu et al. | |
| 2004/0001374 A1 | 1/2004 | Tanaka et al. | |
| 2004/0026682 A1 | 2/2004 | Jiang | |
| 2004/0052117 A1 | 3/2004 | Jiang | |
| 2004/0192006 A1 * | 9/2004 | Campbell | H01L 45/085 438/382 |
| 2004/0251551 A1 | 12/2004 | Hideki | |
| 2005/0017233 A1 | 1/2005 | Campbell | |
| 2005/0077515 A1 * | 4/2005 | Kostylev | H01L 45/00 257/52 |
| 2005/0089467 A1 * | 4/2005 | Grill | B82Y 10/00 423/447.3 |
| 2005/0148150 A1 | 7/2005 | Moore et al. | |
| 2005/0167689 A1 | 8/2005 | Campbell et al. | |
| 2006/0131555 A1 | 6/2006 | Liu et al. | |
| 2007/0023744 A1 * | 2/2007 | Campbell | H01L 45/085 257/4 |
| 2007/0034848 A1 | 2/2007 | Liu | |
| 2007/0138010 A1 | 6/2007 | Ajayan | |
| 2008/0012461 A1 * | 1/2008 | Yaniv | H01J 1/304 313/309 |
| 2010/0244262 A1 * | 9/2010 | Awano | B82Y 10/00 257/758 |

OTHER PUBLICATIONS

Thurn-Albrecht, T., et al., Ultrahigh-Density Nanowire Arrays Grown in Self-Assembled Diblock Copolymer Templates, vol. 290 *Science*, Dec. 15, 2000, pp. 2126-2129.

Liang, Jianyu, et al., Two-dimensional Lateral Superlattices of Nanostructures; Nonlithographic Formation by Anodic Membrane Template, vol. 91, No. 4, *American Institute of Physics*, 2002, pp. 2544-2546.

* cited by examiner

RESISTANCE VARIABLE MEMORY DEVICE WITH NANOPARTICLE ELECTRODE AND METHOD OF FABRICATION

This application is a divisional of U.S. patent application Ser. No. 14/524,435, filed Oct. 27, 2014, now U.S. Pat. No. 9,224,948, issued Dec. 29, 2015, which is a continuation of U.S. patent application Ser. No. 13/315,557, filed Dec. 9, 2011, now U.S. Pat. No. 8,878,155, which is a continuation of U.S. patent application Ser. No. 12/355,541, filed Jan. 16, 2009, now U.S. Pat. No. 8,088,643, which is a divisional of U.S. patent application Ser. No. 11/213,830, filed Aug. 30, 2005, now U.S. Pat. No. 7,491,962. Each of the above-listed applications are incorporated by reference in their entirety.

FIELD OF THE INVENTION

The invention relates to the field of random access memory (RAM) devices formed using a resistance variable material.

BACKGROUND

Resistance variable memory elements, which include chalcogenide-based programmable conductor elements, have been investigated for suitability as semi-volatile and non-volatile random access memory devices. One such device is disclosed, for example, in U.S. Pat. No. 6,849,868 to Campbell, which is incorporated herein by reference.

In a chalcogenide-based programmable conductor memory device, a conductive material, such as silver, is incorporated into a chalcogenide glass. The resistance of the chalcogenide glass can be programmed to stable higher resistance and lower resistance states. An unprogrammed chalcogenide-based programmable conductor memory device is normally in a higher resistance state. A write operation programs the chalcogenide-based programmable conductor memory device to a lower resistance state by applying a voltage potential across the chalcogenide glass. The chalcogenide-based programmable conductor memory device may then be read by applying a voltage pulse of a lesser magnitude than required to program it; the resistance across the memory device is then sensed as higher or lower to define the ON and OFF states.

The programmed lower resistance state of a chalcogenide-based programmable conductor memory device can remain intact for an indefinite period, typically ranging from hours to weeks, after the voltage potentials are removed. The chalcogenide-based programmable conductor memory device can be returned to its higher resistance state by applying a reverse voltage potential of about the same order of magnitude as used to write the device to the lower resistance state. Again, the higher resistance state is maintained in a semi- or non-volatile manner once the voltage potential is removed. In this way, such a device can function as a variable resistance memory having at least two resistance states, which can define two respective logic states, i.e., at least a bit of data.

One exemplary chalcogenide-based programmable conductor memory device uses a germanium selenide (i.e., $Ge_xSe_{100-x}$) chalcogenide glass as a backbone. The germanium selenide glass has, in the prior art, incorporated silver (Ag) and silver selenide ($Ag_2Se$) for memory function. In chalcogenide-based programmable conductor memory devices such as this example, the two resistance states correspond to the presence or absence of a conductive pathway along a conducting channel established within the chalcogenide glass. Because the electrode in contact with the chalcogenide glass is typically substantially flat, but has a surface roughness, the location and number of conducting channels established within the chalcogenide glass is less than completely predictable and controllable due to the variations in electric field produced by this roughness. If multiple conducting channels are formed, the materials utilized for forming the resistance changing conductive pathway (e.g., the silver selenide and silver) may be divided between the various conducting channels, which could cause diminished or inconsistent memory function with respect to the multiple devices of a memory array. More controllable and predictable formation of conducting channel would be desirable.

SUMMARY

In an exemplary embodiment, the invention provides a chalcogenide-based programmable conductor memory device having a layered stack between two conductive layers or electrodes. One of the electrodes comprises at least one nanoparticle.

In an exemplary embodiment of the invention, a nanoparticle is deposited over an electrode utilizing a nanotube through a layer over the electrode. In an exemplary embodiment of the invention, a nanoparticle is deposited over an electrode utilizing an anodized alumina layer having self-ordered nanochannels. In another exemplary embodiment of the invention, a nanoparticle is deposited over an electrode using self-assembled diblock copolymer having self-ordered nanopores. In another exemplary embodiment of the invention, a nanoparticle is deposited over an electrode by chemical vapor deposition (CVD).

The above and other features and advantages of the invention will be better understood from the following detailed description, which is provided in connection with the accompanying drawings.

DETAILED DESCRIPTION

In the following detailed description, reference is made to various specific embodiments of the invention. These embodiments are described with sufficient detail to enable those skilled in the art to practice the invention. It is to be understood that other embodiments may be employed, and that various structural, logical and electrical changes may be made without departing from the spirit or scope of the invention.

The term "substrate" used in the following description may include any supporting structure including, but not limited to, a semiconductor substrate that has an exposed substrate surface. A semiconductor substrate should be understood to include silicon, epitaxial silicon, silicon-on-insulator (SOI), silicon-on-sapphire (SOS), doped and undoped semiconductors, epitaxial layers of silicon supported by a base semiconductor foundation, and other semiconductor structures. When reference is made to a semiconductor substrate or wafer in the following description, previous process steps may have been utilized to form regions or junctions in or over the base semiconductor or foundation. The substrate need not be semiconductor-based, but may be any support structure suitable for supporting an integrated circuit, including, but not limited to, metals, alloys, glasses, polymers, ceramics, and any other supportive materials as is known in the art.

The term "silver" is intended to include not only elemental silver, but silver with other trace metals or in various alloyed combinations with other metals, as long as such silver alloy is conductive, and as long as the physical and electrical properties of the silver remain unchanged.

The term "metal chalcogenide" is intended to include various alloys, compounds, and mixtures of metals (e.g., silver (Ag) and tin (Sn)) and chalcogens (e.g., sulfur (S), selenium (Se), tellurium (Te), polonium (Po), and oxygen (O)), e.g., $Ag_2Se$ and SnSe, including some species which have an excess or deficit of a metal, such as silver or tin.

The term "chalcogenide glass" is intended to include glasses that comprise at least one element from group VIA (also know as group 16) of the periodic table. Group VIA elements (e.g., O, S, Se, Te, and Po) are also referred to as chalcogens.

Figure 1:
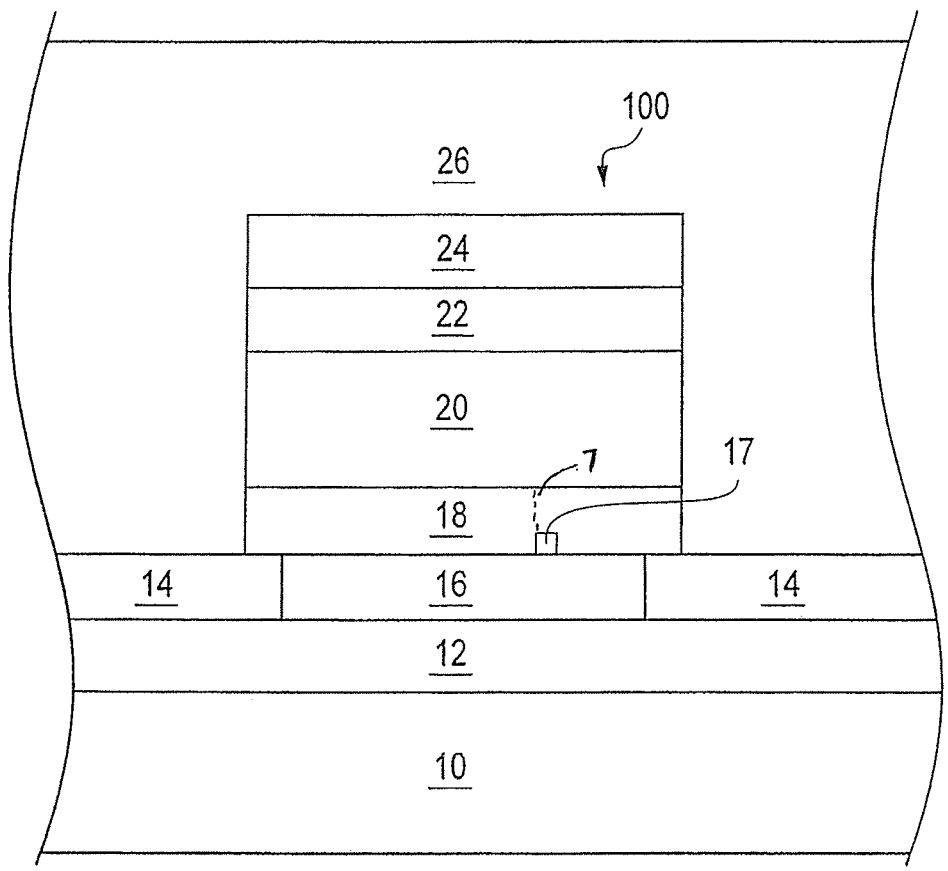
FIGS. 1 and 2 show exemplary embodiments of memory devices in accordance with the invention.

The invention is now explained with reference to the figures, which illustrate exemplary embodiments and throughout which like reference numbers indicate like features. FIG. 1 shows an exemplary embodiment of a chalcogenide-based programmable conductor memory device 100 constructed in accordance with the invention. The device 100 shown in FIG. 1 is supported by a substrate 10. Over the substrate 10, though not necessarily directly so, is a conductive address line 12, which serves as an interconnect for the device 100 shown and a plurality of other similar devices of a portion of a memory array of which the shown device 100 is a part. It is possible to incorporate an optional insulating layer (not shown) between the substrate 10 and address line 12, and this may be preferred if the substrate 10 is semiconductor-based.

The conductive address line 12 can be any material known in the art as being useful for providing an interconnect line, such as doped polysilicon, silver (Ag), gold (Au), copper (Cu), tungsten (W), nickel (Ni), aluminum (Al), platinum (Pt), titanium (Ti), and other materials. Over the address line 12 is a first electrode 16, which can be defined within an insulating layer 14, if desired, and which is also over the address line 12. This electrode 16 can be any conductive material that will not migrate into chalcogenide glass, but is preferably tungsten (W) or titanium nitride (TiN). The insulating layer 14 should not allow the migration of silver (or other metal, e.g., copper) ions and can be an insulating nitride, such as silicon nitride ($Si_3N_4$), a low dielectric constant material, an insulating glass, or an insulating polymer, but is not limited to such materials.

At least one nanoparticle 17 is provided over the electrode 16. The surface area of the electrode 16, over which the nanoparticle 17 is positioned, can be from about 100 $nm^2$ to more than about 10,000 $nm^2$. The nanoparticle 17 can be generally spherical, semi-spherical, or pebble-like in shape, although not necessarily so. More than one nanoparticle 17 over the electrode 16 is allowable, but a single nanoparticle 17 is preferred. The nanoparticle 17 can be any inert, conductive material that will not react with the subsequently deposited layers of the memory device 100 memory element (discussed below), e.g., chalcogenide glass (layer 18) and metal chalcogenide (layer 20), and will not migrate into the chalcogenide glass 18, for example, in response to an applied voltage or thermal energy. Preferably the nanoparticle 17 is selected from tungsten (W), titanium nitride (TiN), platinum (Pt), palladium (Pd), ruthenium (Ru), or their alloys, but the nanoparticle 17 material is not limited to these materials.

The nanoparticle 17 can be between about 3 nm to about 20 nm in diameter. Preferably the nanoparticle is about 10 nm in diameter. The nanoparticle 17 should be significantly larger than the natural roughness of the first electrode 16, which can be, e.g., between about 4 Å and 25 Å, or about 0.20 ($R_a$μm), so as to serve as an effective bottom electrode contact to the overlying memory element (as described below). However, the nanoparticle 17 should not be too large because the local electric field strength (discussed below) depends on the curvature of the nanoparticle 17. Larger nanoparticles 17 have relatively smaller curvature and produce relatively less electric field than smaller nanoparticles 17. Also, larger nanoparticles 17 can cause cell deposition step coverage and topography problems during subsequent material deposition.

Use of a nanoparticle 17 over the first electrode 16 effectively makes the nanoparticle 17 the electrode for the memory device 100 because the nanoparticle creates a relatively large, localized electric field (relative to the rest of the electrode 16) in response to an applied voltage that facilitates memory device 100 switching. As discussed above, the electric field strength at the nanoparticle 17 in response to an applied voltage depends on the nanoparticle 17 curvature. When a nanoparticle 17 is deposited on a flat electrode surface (such as that of electrode 16), followed by deposition of other materials of the memory element, the nanoparticle 17 makes electric contact with the subsequently deposited material. Due to the small size of the nanoparticle 17, the curvature of its surface is large and causes a large local electric field in response to an applied voltage, e.g., a conditioning voltage or a programming voltage. Therefore, a conducting channel in the memory element is most likely formed at the nanoparticle 17 contact with the chalcogenide glass 18 when the memory device 100 is initially conditioned with a voltage pulse. Use of the nanoparticle 17 promotes consistency and controllability of the memory device 100.

A memory element, i.e., the portion of the memory device 100 that stores information, is formed over the first electrode 16 and nanoparticle 17. In the embodiment shown in FIG. 1, a layer of chalcogenide glass 18, preferably a germanium chalcogenide such as germanium selenide ($Ge_xSe_{100-x}$), can be provided over the first electrode 16 and nanoparticle 17. The germanium selenide can be within a stoichiometric range of about $Ge_{20}Se_{80}$ to about $Ge_{43}Se_{57}$, preferably about $Ge_{40}Se_{60}$, i.e., $Ge_2Se_3$. The layer of chalcogenide glass 18 can be between about 100 Å and about 1000 Å thick, preferably about 300 Å thick. Layer 18 need not be a single layer of glass, but may also be comprised of multiple sub-layers of chalcogenide glass having the same or different stoichiometries. This layer of chalcogenide glass 18 is in electrical contact with the underlying electrode 16.

Over the chalcogenide glass layer 18 is a region 20 of metal chalcogenide, preferably tin selenide ($Sn_xSe$, where x is between about 0 and 2) or silver selenide ($Ag_ySe$, where y is about 2). It is also possible that other chalcogenide materials may be substituted for selenium here, such as sulfur, oxygen, or tellurium; however, selenium is preferred. The metal chalcogenide region 20 is at least about 500 Å thick, preferably about 1,000 Å to about 2,000 Å thick; however, its thickness depends, in part, on the thickness of the underlying chalcogenide glass layer 18. The ratio of thickness of the metal chalcogenide region 20 to the chalcogenide glass layer 18 can be about 1:1 to about 7:1.

Still referring to FIG. 1, a metal layer 22, which is preferably silver, can be provided over the silver selenide region 20. This metal layer 22 should be about 500 Å thick. This silver (or other metal) layer 22 assists the switching operation of the memory device by providing metal ions for forming a conductive pathway along the conducting channel, which is typically formed from the nanoparticle 17 through the chalcogenide glass layer 18. Over the metal layer 22 is a second electrode 24. The second electrode 24 can be made of the same material as the first electrode 16, but is not required to be so. In the exemplary embodiment shown in FIG. 1, the second electrode 24 is preferably tungsten (W). The device 100 may be isolated by an insulating layer 26. The memory device 100 shown in FIG. 1 is a simplified exemplary embodiment of the invention. Other alternative embodiments may have more glass layers, as shown, for example, in FIG. 2 (layers 18a and 18b), or may be provided within a via or may be made of blanket layers over an electrode such as electrode 16. Also, alternative embodiments may provide a common electrode in place of the dedicated electrode 16, shown in FIG. 1.

In accordance with the embodiment shown at FIG. 1, in a completed memory device 100, the metal chalcogenide region 20 provides a source of material, for example, silver selenide, which is incorporated into chalcogenide glass layer 18 during a conditioning step after formation of the memory device 100, which forms a conducting channel at the nanoparticle 17. Specifically, the conditioning step comprises applying a potential across the memory element structure of the device 100 such that material from the metal chalcogenide region 20 and metal layer 22 is incorporated into the chalcogenide glass layer 18, thereby forming a conducting channel in the chalcogenide glass layer 18. Movement of metal, e.g., silver, ions into or out of the conducting channel during subsequent programming respectively forms or dissolves a conductive pathway, which causes a detectible resistance change across the memory device 100.

Figure 2:
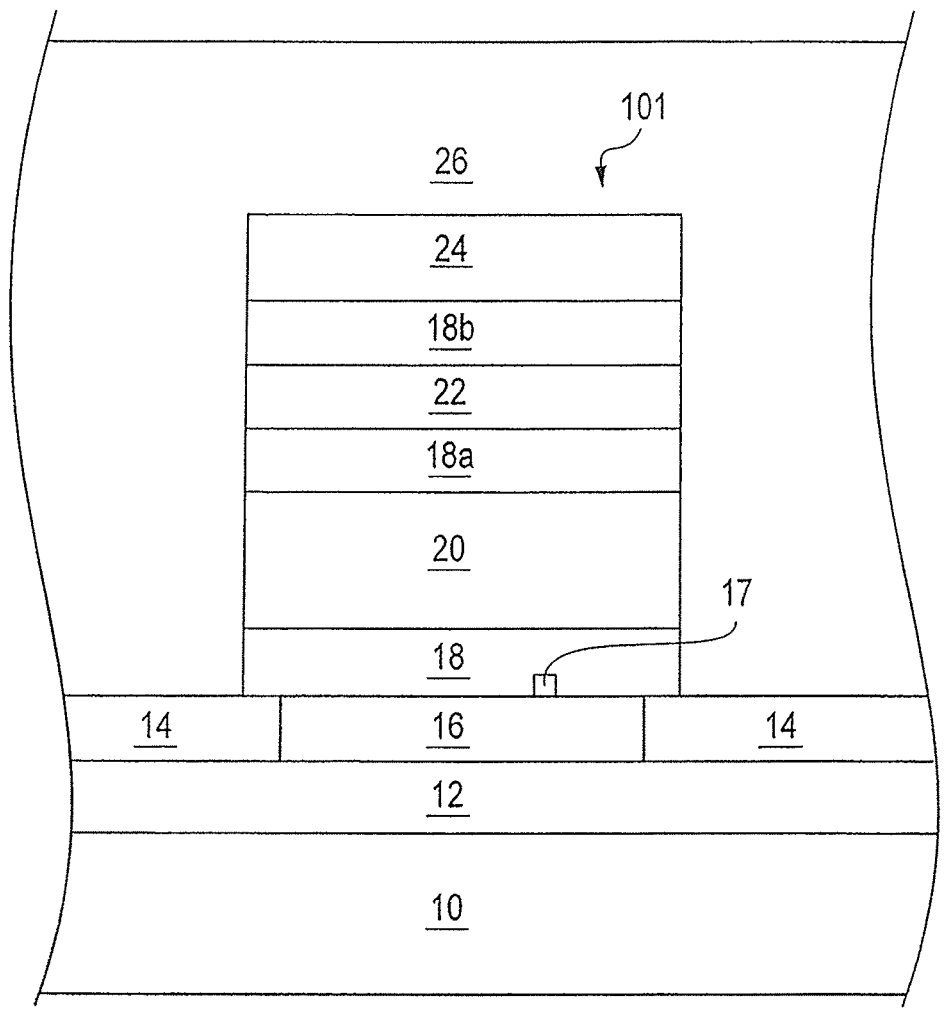

FIG. 2 shows another exemplary embodiment of a memory device 101 constructed in accordance with the invention. Memory device 101 has many similarities to memory device 100 of FIG. 1 and layers designated with like reference numbers are preferably the same materials and have the same thicknesses as those described in relation to the embodiment shown in FIG. 1. The primary difference between device 100 and device 101 is the addition to device 101 of an optional second chalcogenide glass layer 18a and an optional third chalcogenide glass layer 18b on either side of the metal layer 22.

The optional second chalcogenide glass layer 18a is formed over the metal chalcogenide region 20, is preferably $Ge_2Se_3$, and is preferably about 150 Å thick. Over this optional second chalcogenide glass layer 18a is the metal layer 22, which is preferably silver (Ag) and is preferably about 500 Å thick. Over the metal layer 22 is an optional third chalcogenide glass layer 18b, which is preferably $Ge_2Se_3$ and is preferably about 100 Å thick. The optional third chalcogenide glass layer 18b provides an adhesion layer for subsequent electrode formation. As with layer 18 of FIG. 1, layers 18a and 18b are not necessarily a single layer, but may be comprised of multiple sub-layers. Additionally, the optional second and third chalcogenide layers 18a and 18b may be a different chalcogenide glass from the first chalcogenide glass layer 18 or from each other.

Over the optional third chalcogenide glass layer 18b is a second electrode 24, which may be any conductive material, but is preferably not one that will migrate into the memory element stack and alter memory operation (e.g., not Cu or Ag), as discussed above for the preceding embodiments. Preferably, the second electrode 24 is tungsten (W). As with memory device 100 of FIG. 1, memory device 101 also utilizes and incorporates at least one nanoparticle 17 over the electrode 16 and in contact with the chalcogenide glass layer 18.

FIGS. 3-8 illustrate a cross-sectional view of a wafer during the fabrication of a memory device 100 (FIG. 1) in accordance with the invention. Although the processing steps shown in FIGS. 3-8 most specifically refer to memory device 100 of FIG. 1, the methods and techniques discussed may also be used to fabricate other memory device structures, such as shown in FIG. 2, as would be understood by a person of ordinary skill in the art based on a reading of this specification.

Figure 3:
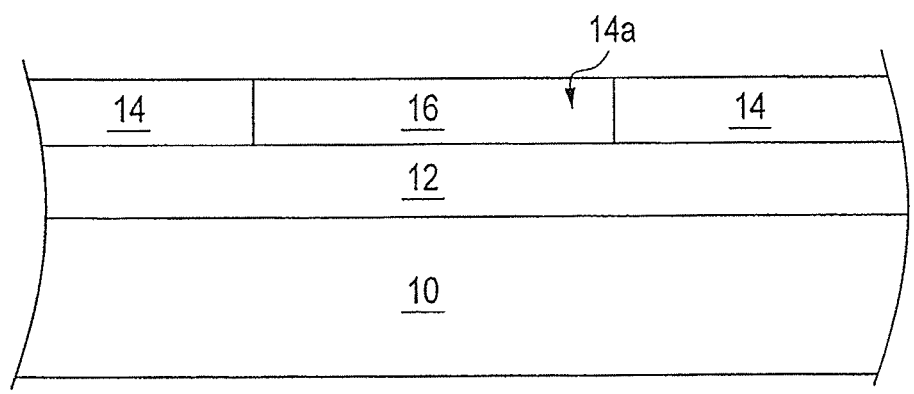
FIGS. 3-8 show exemplary sequential stages of processing during the fabrication of a memory device as in FIG. 2, in accordance with the invention.

As shown by FIG. 3, a substrate 10 is provided. As indicated above, the substrate 10 can be semiconductor-based or another material useful as a supporting structure for an integrated circuit, as is known in the art. If desired, an optional insulating layer (not shown) can be formed over the substrate 10; the optional insulating layer may be silicon nitride or other insulating materials used in the art. Over the substrate 10 (or optional insulating layer, if desired), a conductive address line 12 is formed by depositing a conductive material, such as doped polysilicon, aluminum, platinum, silver, gold, nickel, but preferably tungsten, patterning one or more conductive lines, for example, with photolithographic techniques, and etching to define the address line 12. The conductive material can be deposited by any technique known in the art, such as sputtering, chemical vapor deposition, plasma enhanced chemical vapor deposition, evaporation, or plating.

Still referring to FIG. 3, an insulating layer 14 is formed over the address line 12. This layer 14 can be silicon nitride, a low dielectric constant material, or many other insulators known in the art that do not allow silver (or copper) ion migration, and may be deposited by any method known in the art. An opening 14a in the insulating layer 14 is made, for example, by photolithographic and etching techniques, thereby exposing a portion of the underlying address line 12. This opening 14a will define the electrode 16 formed therein (discussed below) and can provide an open area of about 100 $nm^2$ to about 10,000 $nm^2$ exposing the address line 12. Over the insulating layer 14, within the opening 14a, and over the address line 12 is formed a conductive material, preferably tungsten (W). A chemical mechanical polishing (CMP) step may then be utilized, using the insulating layer 14 as a stop, to remove the conductive material from over the insulating layer 14, to leave it as a first electrode 16 over the address line 12, and planarize the wafer. The first electrode 16 can have a surface area of about 100 $nm^2$ to about 10,000 $nm^2$.

Figure 4A:
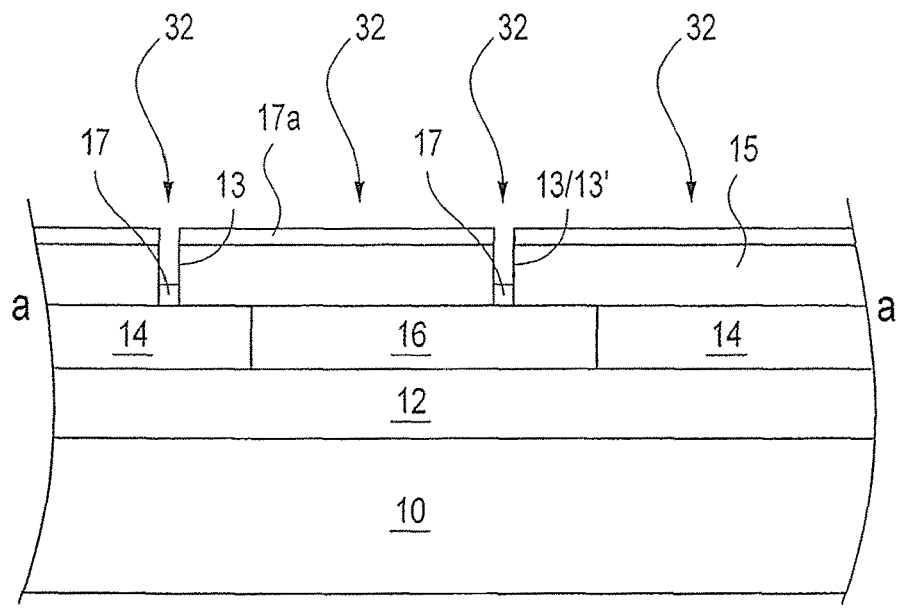
Figure 4B:
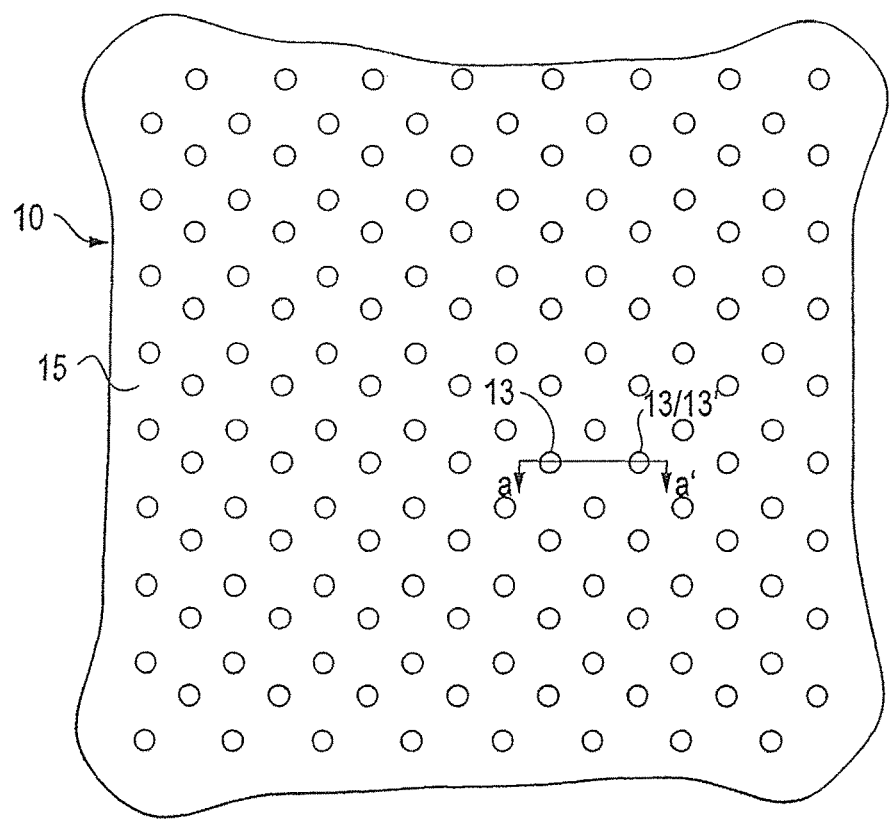

FIG. 4a shows the formation of a nanoparticle 17 over the first electrode 16, according to an exemplary embodiment of the invention. As shown in FIG. 4a, a template 15 for forming nanoparticles is formed over the substrate 10 and over the insulating layer 14 and first electrode 16. FIG. 4b shows the template 15 from an overhead view; FIG. 4a shows a cross-sectional view of the template 15 and portions of the device 100 through line a-a'. Template 15 can be formed by known techniques so as to have regularly spaced nanopores or nanochannels, i.e., feature 13 or 13', such that one or more nanopores or nanochannels are located over the electrode 16. Preferably, the template 15 is formed such that no more than about one or two nanopores or nanochannels (e.g., feature 13 or 13') are located over each electrode 16.

According to an exemplary embodiment of the invention, the template 15 is an anodic aluminum oxide layer. In such an embodiment, a layer of aluminum can be deposited over the substrate 10 so that it covers the electrode 16 and insulating layer 14. A backside bias is applied to the substrate 10 to anodize the aluminum layer so that it becomes aluminum oxide with self-ordered nanochannels, e.g., feature 13, to the underlying electrode 16 and insulating layer 14.

The size, density, and array spacing of the nanochannels, e.g., feature 13, can be tuned or controlled by adjusting the anodizing voltage, electrolyte composition of the anodizing solution, and temperature setting. By adjusting these parameters, nanochannels, e.g., feature 13, can be produced with diameters ranging from 10 nm to several hundred nanometers and the density of nanochannels can be controlled up to $10^{11}/cm^2$. The goal of this tuning or controlling of nanochannel formation is to position about one nanochannel, e.g., feature 13, over each electrode 16 so that about one nanoparticle 17 can be formed therein. More than one nanochannel, e.g., feature 13, can be formed over the first electrode 16; however no more than two is preferred.

When utilizing this anodized alumina method, a back bias of between about 30V and 50V can be used, preferably about 40V. The temperature of the substrate 10 can be between about 5° C. and 20° C., preferably about 15° C. The aluminum can be between about 30 nm and 1 μm thick, preferably about 100 nm. An anodizing solution of either oxalic acid solution or phosphoric acid solution can be used during this process. Techniques for forming nanostructures, e.g., nanotubes and/or nanowires, are described, for example, in U.S. Pat. Nos. 6,325,909; 6,538,367; 6,548,313; 6,515,325; 6,566,665; and 6,566,704, which are incorporated herein by reference.

A layer of nanoparticle material 17a is deposited 32 over the template 15 and within the nanochannels (e.g., feature 13) over the electrode 16. The process parameters for the deposition of nanoparticles 17 into the nanochannel, e.g., feature 13, in anodic alumina are not critical to the invention, since any collimated PVD method can be used to deposit the material 17a, such as evaporation or collimated splluttering, for example. The material 17a thickness is normally about the same as the desired nanoparticle size, e.g., about the same as the nanochannel size, between about 3 nm and 20 nm. The deposition rate should be relatively slow to ensure precise control of the deposition process, typically about 0.05 Å/s to about 0.5 Å/s. After depositing 32 the nanoparticle material 17a, the anodized alumina is selectively removed using, for example, a nitric acid or fluoric acid solution.

In an alternate exemplary embodiment in accordance with the invention, the template 15 can be a layer of self-assembled diblock copolymer having regularly spaced nanopores, e.g., feature 13'. The diblock copolymers can be composed of polystyrene and polymethylmethacrylate (PMMA). The volume fraction of polystyrene in the copolymer is designed in such a way that the copolymer self-assembles into arrays of small PMMA cylinders hexagonally packed in a polystyrene matrix, as shown from above in FIG. 4b, with cylinder density dependent on the volume ratio.

The copolymer, in a toluene solution, can be spun onto the substrate 10, followed by annealing at temperature above the glass transition temperature (e.g., at about 165° C. for 14 hours) of both components under an externally applied electric field (about 30V to 40V per μm) perpendicular to the substrate. The anneal under the perpendicular electric field forms the PMMA cylinders, which are oriented perpendicular to the substrate 10. An array of nanopores, e.g., feature 13', with hexagonal symmetry is formed on the substrate by removing the PMMA cylinders but not polystyrene. The PMMA cylinders can be removed by UV degredation and acetic acid rinse.

A directional PVD method, for example, evaporation or collimated sputtering, can be used to deposit (32) pockets of conductive material 17a through the nanopores, e.g., feature 13', onto the first electrode 16. The subsequent selective removal of the polystyrene matrix using a solvent, e.g., acetone, leaves the nanoparticles 17 that can serve as effective bottom electrode contacts of memory devices as shown in FIGS. 1 and 2.

Figure 5:
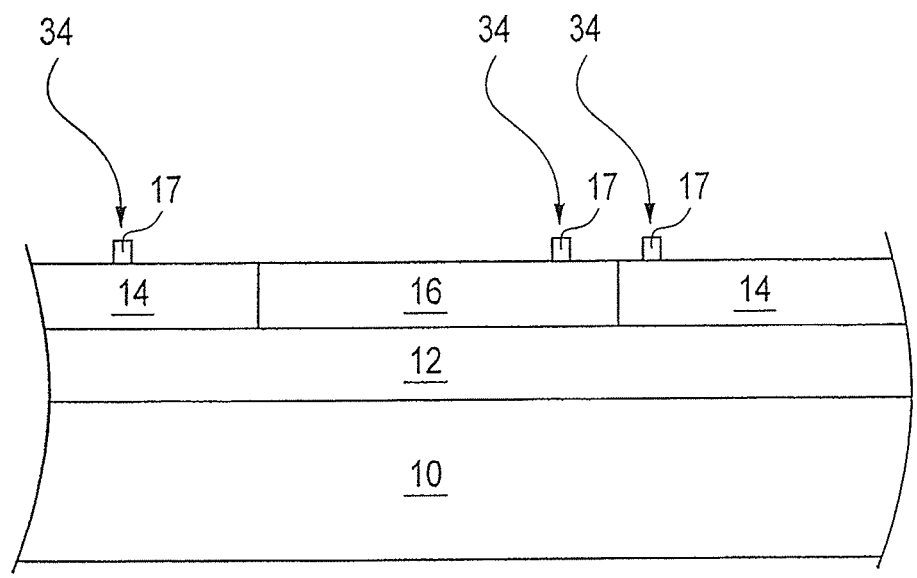

In another alternate exemplary embodiment in accordance with the invention, as shown in FIG. 5, no template (e.g., template 15 of FIG. 4a) is used in forming the nanoparticles 17 over the substrate 10. Chemical vapor deposition (CVD) may be used to randomly deposit the nanoparticles 17 over the first electrode 16. The desired density of these randomly deposited nanoparticles 17 should be large enough to ensure positioning of one or only a few nanoparticles 17 on the first electrode 16, preferably about one nanoparticle 17. In the case of an electrode 16 about 100 $nm^2$ in size, the density of nanoparticles 17 deposited by CVD should be about $10^{14}/m^2$. The deposition density should proportionally decrease if larger electrode 16 surface areas are used.

To deposit nanoparticles 17 by CVD method, plasma can be used to enhance the deposition and precursor breakdown. For example, ruthenium (Ru) nanoparticles can be deposited with precursor tricarbonyl(1,3-cyclohexadiene)ruthenium (molecular formula $(C_6H_8)Ru(CO)_3$) in the presence of helium (He) plasma. The process conditions depend on the size and density of nanoparticles deposited. The deposition temperature can be about 300° C. The precursor is carried by about 500 sccm carrier gas. The carrier gas can be helium and the plasma power can be about 300 W. Platinum nanoparticles can be deposited with precursor $(CH_3)_3(CH_3C_5H_4)Pt$ (also known as Pt10) in the presence of $O_2$ and He plasma.

Figure 6:
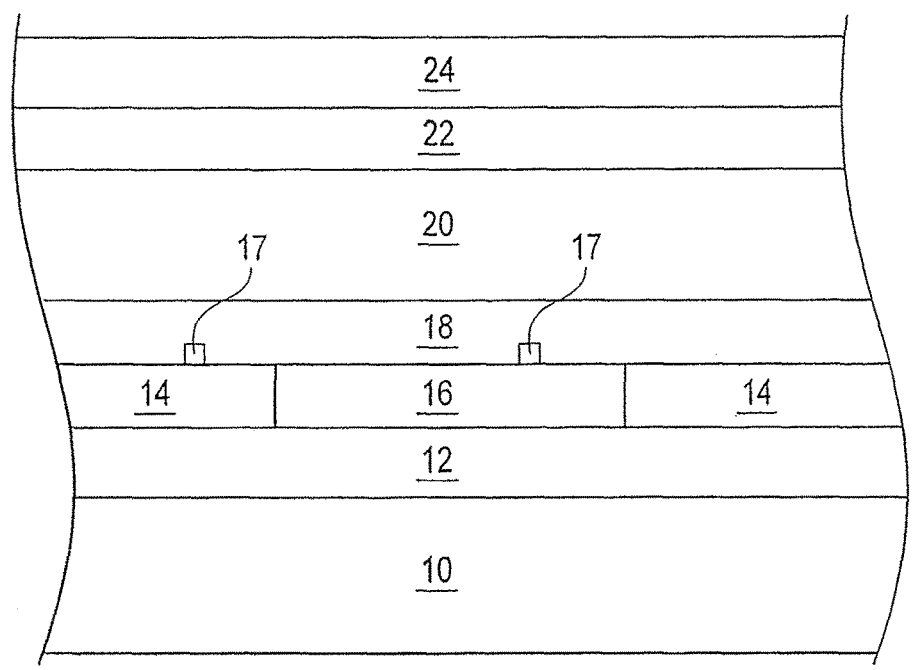

Regardless of which method of nanoparticle 17 formation is utilized, it is preferred, but not required, that only about one nanoparticle 17 be formed over each electrode 16, which is one of many like electrodes of an array. FIG. 6 shows the cross-section of the wafer of FIG. 4a or FIG. 5 at a subsequent stage of processing. A series of layers making up the memory device 100 (FIG. 1) are blanket-deposited over the wafer. A chalcogenide glass layer 18 is formed to a preferred thickness of about 300 Å over the first electrode 16, nanoparticle(s) 17, and insulating layer 14. The chalcogenide glass layer 18 is preferably $Ge_2Se_3$. Deposition of this chalcogenide glass layer 18 may be accomplished by any suitable method, such as evaporative techniques or chemical vapor deposition using germanium tetrahydride ($GeH_4$) and selenium dihydride ($SeH_2$) gases; however, the preferred technique utilizes either sputtering from a germanium selenide target having the desired stoichiometry or co-sputtering germanium and selenium in the appropriate ratios.

Still referring to FIG. 6, a metal chalcogenide layer 20, preferably silver selenide or tin selenide, is formed over the chalcogenide glass layer 18. The metal chalcogenide layer 20 can be formed by any suitable technique, preferably sputtering. Again, the thickness of layer 20 is selected based, in part, on the thickness of layer 18.

Still referring to FIG. 6, a metal layer 22 is formed over the second chalcogenide glass layer 18a. The metal layer 22 is preferably silver (Ag), or at least contains silver, and is formed to a preferred thickness of about 500 Å. The metal layer 22 can be deposited by any technique known in the art. A conductive material is deposited over the metal layer 22 to form a second electrode 24 layer. Again, this conductive material can be any material suitable for a conductive electrode, but is preferably tungsten; however other materials can be used such as titanium nitride for example.

Figure 7:
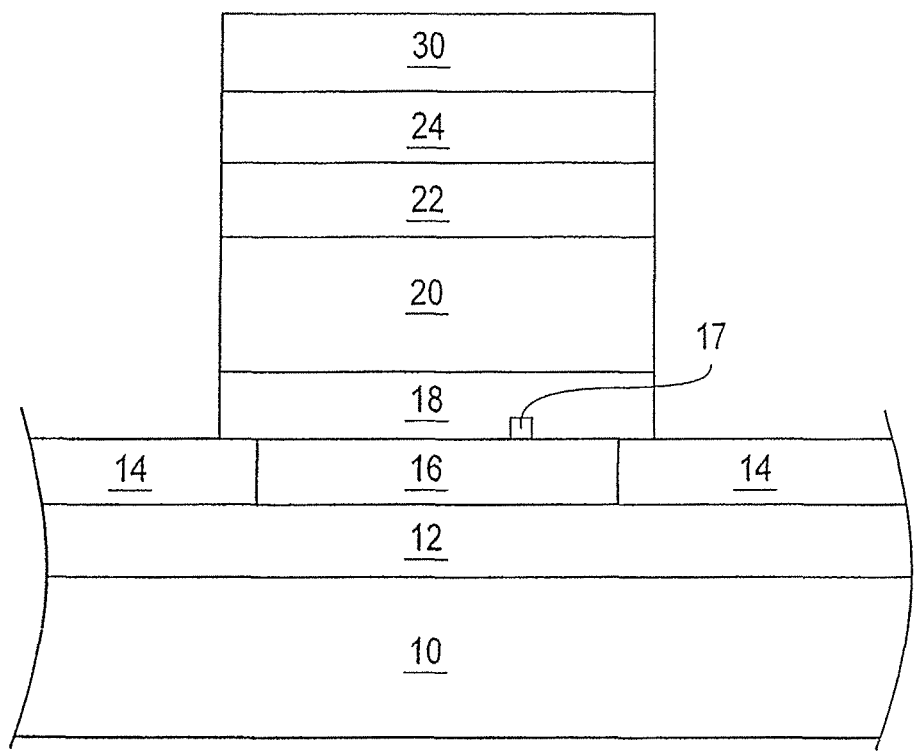
Figure 8:
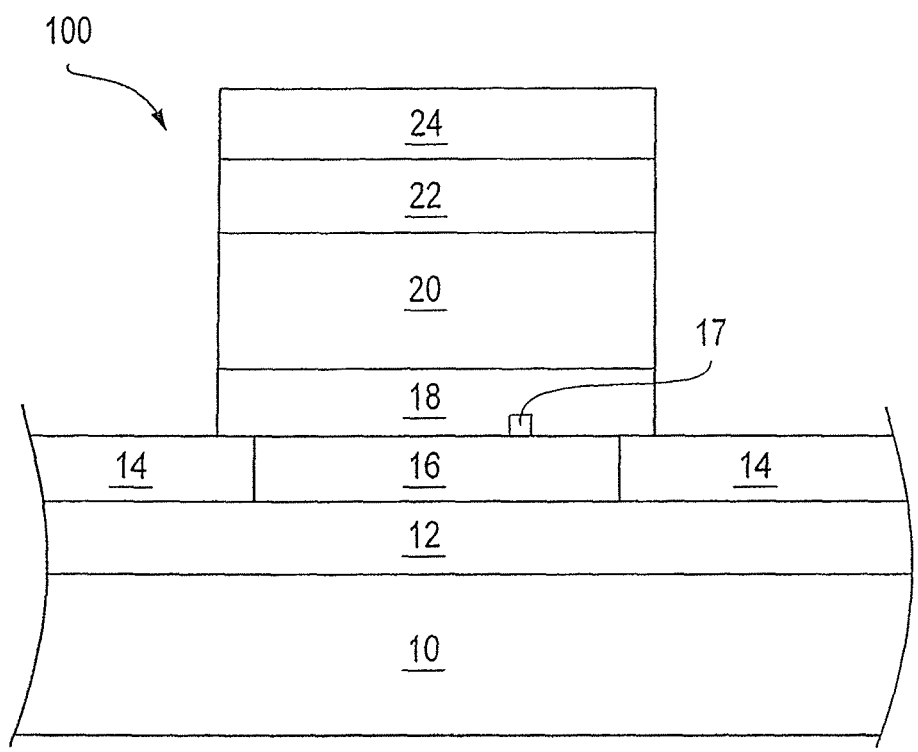

Now referring to FIG. 7, a layer of photoresist 30 is deposited over the top electrode 24 layer, masked and patterned to define the stacks for the memory device 100, which is one of a plurality of like memory devices of a memory array. An etching step is used to remove portions of layers 18, 20, 22, and 24, with the insulating layer 14 used as an etch stop, leaving stacks as shown in FIG. 7. The photoresist 30 is removed, leaving a substantially complete memory device 100, as shown by FIG. 8. An insulating layer 26 may be formed over the device 100 to achieve a structure as shown by FIG. 1. This isolation step can be followed by the forming of connections to other circuitry of the integrated circuit (e.g., logic circuitry, sense amplifiers, etc.) of which the memory device 101 is a part, as is known in the art.

A conditioning step is performed by applying a voltage pulse to incorporate material from the metal chalcogenide layer 20 and metal layer 22 into the chalcogenide glass layer 18 to form a conducting channel in the chalcogenide glass layer 18. The presence of the nanoparticle 17 should dictate the location of the conducting channel thereover. The conducting channel will support a conductive pathway during operation of the memory device 100, the presence or lack of which provides at least two detectable resistance states for the memory device 100.

The embodiments described above refer to the formation of only a few possible chalcogenide-based programmable conductor memory devices in accordance with the invention, which may be part of a memory array. It must be understood, however, that the invention contemplates the formation of other memory structures within the spirit of the invention, which can be fabricated as a memory array and operated with memory element access circuits.

Figure 9:
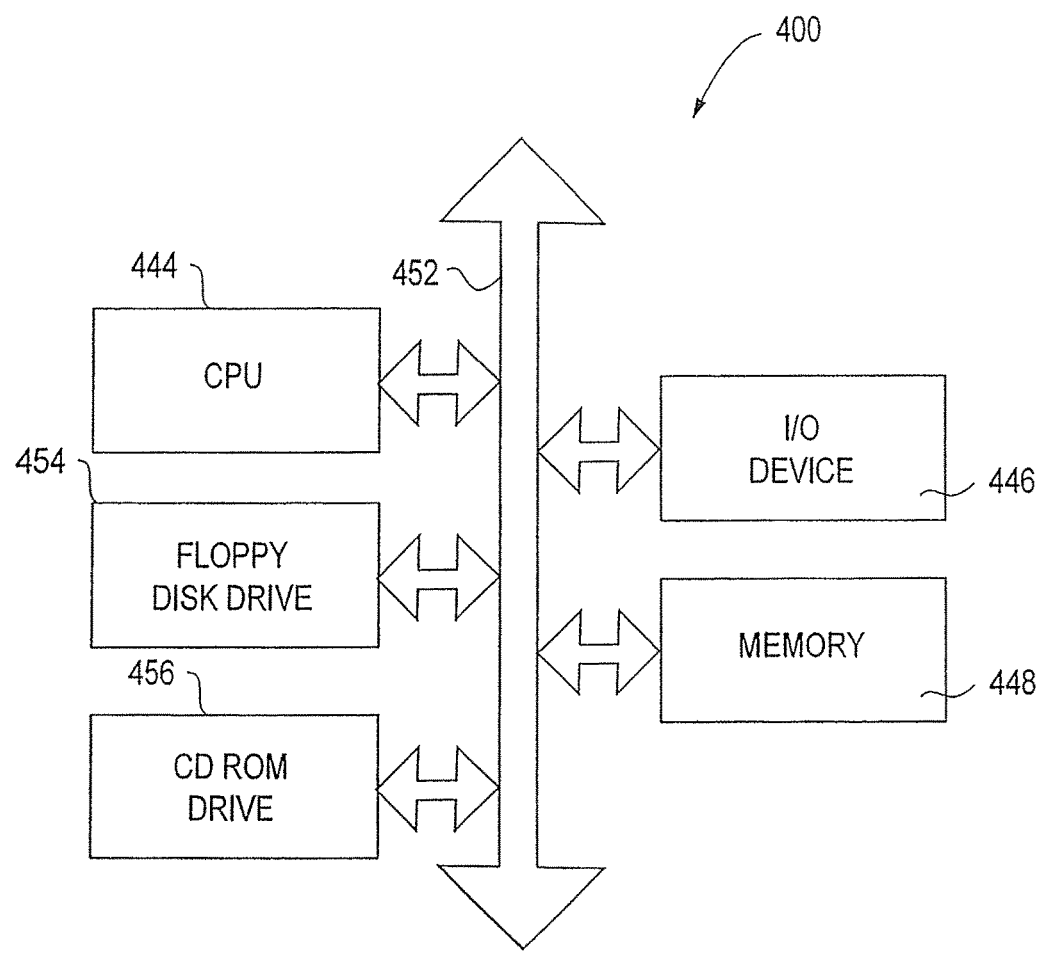
FIG. 9 shows an exemplary processor-based system incorporating a memory device in accordance with the invention.

FIG. 9 illustrates a processor system 400 which includes a memory circuit 448 employing chalcogenide-based programmable conductor memory devices (e.g., device 100 and 101) fabricated in accordance with the invention. A processor system, such as a computer system, generally comprises a central processing unit (CPU) 444, such as a microprocessor, a digital signal processor, or other programmable digital logic devices, which communicates with an input/output (I/O) device 446 over a bus 452. The memory circuit 448 communicates with the CPU 444 over bus 452, typically through a memory controller.

In the case of a computer system, the processor system may include peripheral devices, such as a floppy disk drive 454 and a compact disc (CD) ROM drive 456, which also communicate with CPU 444 over the bus 452. Memory circuit 448 is preferably constructed as an integrated circuit, which includes one or more resistance variable memory devices, e.g., device 100. If desired, the memory circuit 448 may be combined with the processor, for example CPU 444, in a single integrated circuit.

The above description and drawings should only be considered illustrative of exemplary embodiments that achieve the features and advantages of the invention. Modification and substitutions to specific process conditions and structures can be made without departing from the spirit and scope of the invention. Accordingly, the invention is not to be considered as being limited by the foregoing description and drawings, but is only limited by the scope of the appended claims.

What is claimed as new and desired to be protected by Letters Patent of the United States is:

1. A method of forming a chalcogenide-based programmable conductor memory device, comprising:
    forming a first electrode;
    forming an aluminum layer over said first electrode;
    anodizing said aluminum layer such that about one nanochannel is formed therein to said first electrode;
    depositing a layer of nanoparticle material over said anodized aluminum layer, within said nanochannel, and over said first electrode where exposed in said nanochannel;
    selectively removing said anodized aluminum layer and the nanoparticle material thereover to leave about one nanoparticle on said first electrode;
    providing a first germanium selenide layer over said first electrode and said nanoparticle; and
    providing a second electrode over said first germanium selenide layer.

2. The method of claim 1, wherein said nanoparticle comprises an inert, conductive material.

3. The method of claim 1, wherein said nanoparticle comprises a material selected from the group consisting of tungsten, titanium nitride, platinum, palladium, ruthenium and alloys of tungsten, titanium nitride, platinum, palladium, and ruthenium.

4. The method of claim 1, wherein said anodizing is performed using a bias of about 30V to about 50V.

5. The method of claim 1, wherein said anodizing is performed using a bias of about 40V.

6. The method of claim 1, wherein said anodizing is performed at about 5° C. to about 20° C.

7. The method of claim 1, wherein said anodizing is performed at about 15° C.

8. The method of claim 1, wherein said anodizing utilizes a solution comprising oxalic acid.

9. The method of claim 1, wherein said anodizing utilizes a solution comprising phosphoric acid.

10. The method of claim 1, wherein said aluminum layer is about 30 nm to about 1 μm thick.

11. The method of claim 1, wherein said aluminum layer is formed to be about 100 nm thick.

12. The method of claim 1, wherein said nanochannel is formed to be about 3 nm to about 20 nm wide.

13. The method of claim 1, wherein said nanoparticle material is deposited at a rate of about 0.05 Å/second to about 0.5 Å/second.

14. The method of claim 1, wherein said selective removal of said anodized aluminum layer comprises etching with a nitric acid solution.

15. The method of claim 1, wherein said selective removal of said anodized aluminum layer comprises etching with a fluoric acid solution.

16. The method of claim 1, wherein said nanoparticle is between about 3 nm and 20 nm in diameter.

17. The method of claim 1, wherein said nanoparticle is about 10 nm in diameter.

18. The method of claim 1, further comprising:
    providing a metal selenide layer over said first germanium selenide layer;
    providing a second germanium selenide layer over said metal selenide layer;
    providing a metal layer over said second germanium selenide layer, said metal layer comprising silver; and providing a third germanium selenide layer over said metal layer.

* * * * *